United States Patent
Mocholí Salcedo et al.

(10) Patent No.: US 12,243,419 B2
(45) Date of Patent: Mar. 4, 2025

(54) SYSTEM AND METHOD FOR MONITORING PERSONAL MOBILITY VEHICLES IN URBAN ENVIRONMENTS

(71) Applicants: Fernando Mocholi Salcedo, Valencia (ES); Pilar Belenguer Molmeneu, Valencia (ES); Universitat Politécnica de Valéncia, Valencia (ES)

(72) Inventors: Antonio Mocholí Salcedo, Valencia (ES); Ferrán Mocholí Belenguer, Valencia (ES); Antonio Martinez Millana, Valencia (ES); Clara Perez Fuster, Valencia (ES); Carlos Moyano Gomez, Valencia (ES)

(73) Assignee: UNIVERSITAT POLITÉCNICA DE VALÉNCIA, Valencia (ES)

( * ) Notice: Subject to any disclaimer, the term of this patent is extended or adjusted under 35 U.S.C. 154(b) by 69 days.

(21) Appl. No.: 18/267,955

(22) PCT Filed: Nov. 25, 2021

(86) PCT No.: PCT/ES2021/070849
§ 371 (c)(1),
(2) Date: Jun. 16, 2023

(87) PCT Pub. No.: WO2022/129654
PCT Pub. Date: Jun. 23, 2022

(65) Prior Publication Data
US 2024/0054893 A1 Feb. 15, 2024

(30) Foreign Application Priority Data
Dec. 18, 2020 (ES) ................ ES202031271

(51) Int. Cl.
*G08G 1/01* (2006.01)
*G08G 1/042* (2006.01)
(Continued)

(52) U.S. Cl.
CPC .............. *G08G 1/042* (2013.01); *G08G 1/052* (2013.01); *G08G 1/056* (2013.01); *H03L 7/093* (2013.01)

(58) Field of Classification Search
CPC ........ G08G 1/042; G08G 1/052; G08G 1/056; H03L 7/093; G01V 3/101
(Continued)

(56) References Cited

U.S. PATENT DOCUMENTS 4,358,749 A * 11/1982 Clark ................ G01V 3/101
331/25
4,368,428 A * 1/1983 Dijkman .............. G01P 3/54
340/936

(Continued)

FOREIGN PATENT DOCUMENTS

| WO | 9729468 A1 | 8/1997 |
|---|---|---|
| WO | 2004032089 A1 | 4/2004 |
| WO | 2007014573 A1 | 2/2007 |

OTHER PUBLICATIONS

International Search Report mailed in PCT/ES2021/070849 on Aug. 2, 2022. 4 pages.

*Primary Examiner* — Anh V La
(74) *Attorney, Agent, or Firm* — ARENTFOX SCHIFF LLP

(57) ABSTRACT

A system and method for monitoring personal mobility vehicles in urban environments, comprising a double magnetic coil (1), disposed at an area of personal mobility vehicle traffic, and connected to an oscillator circuit (2), a phase-locked loop (3), a signal conditioning circuit (4) and a signal processor (5); where the signal processor (5) is configured to calculate the temporal variation in voltage (V(t), V'(t)) produced in the phase-locked loop (3) and due to a variation in the oscillation frequency of the double magnetic coil (1) when at least one personal mobility vehicle (Continued)

passes said double magnetic coil (1); and to establish the type, speed, direction of travel and length of the personal mobility vehicle that has generated the variation in the oscillation frequency of the double magnetic coil (1).

4 Claims, 3 Drawing Sheets

(51) Int. Cl.
*G08G 1/052* (2006.01)
*G08G 1/056* (2006.01)
*H03L 7/093* (2006.01)

(58) Field of Classification Search
USPC .................... 340/941, 933, 936, 935, 934
See application file for complete search history.

(56) References Cited

U.S. PATENT DOCUMENTS

| | | | |
|---|---|---|---|
| 6,360,163 B1 | 3/2002 | Cho et al. | |
| 7,116,248 B2 * | 10/2006 | Lu .......................... | G08G 1/042 340/919 |
| 8,842,023 B2 * | 9/2014 | Potter, Sr. .............. | G08G 1/015 340/933 |
| 10,109,187 B2 * | 10/2018 | Lees ...................... | G08G 1/042 |

* cited by examiner

SYSTEM AND METHOD FOR MONITORING PERSONAL MOBILITY VEHICLES IN URBAN ENVIRONMENTS

CROSS-REFERENCE TO RELATED APPLICATIONS

This application is a National Stage Entry of PCT/ES2021/070849, filed Nov. 25, 2021, which claims priority to Spanish Application No. P202031271, filed Dec. 18, 2020, the disclosures of each of which are hereby incorporated by reference in their entireties.

TECHNICAL FIELD

The present invention relates to a system and method for monitoring personal mobility vehicles in urban environments, including monitoring the presence, counting, type, speed, direction of travel and length of said vehicles.

STATE OF THE ART

Novel technologies applied to the automotive industry, new forms of mobility and the shared economy are changing the way in which the population approaches the world of transport in urban environments. In fact, in recent years electric vehicles for personal mobility have proliferated massively in the main capitals of the world, which has forced the rapid drafting of various regulations to control and manage their use efficiently and guarantee a safe coexistence with the rest of the users. Another current trend is to convert conventional cities into large Smart Cities in which the use of combustion vehicles must be drastically reduced, replacing their use with electric vehicles and personal mobility vehicles. In addition, it is a declared objective that society invests more and more on renewable energies, reducing pollution, and offering a better quality of life and enabling the existence of a large number of devices connected to the network (the so-called Internet of Things) such that cities are practically sensorised.

In this specification, "personal mobility vehicles" are understood as those which are categorised by the General Directorate of Traffic (DGT) in Instruction 16/V-124: http://www.dgt.es/Gaierias/seguridad-vial/normativa-legis-lacion/otras-normas/modificaciones/2016instr_16_V_124_Vehiculos_movlidad_Personal.pdf The proliferation of personal mobility vehicles has caused a considerable impact on modes of travel in the main cities around the world, since they are cheap, light, environmentally-friendly and, in addition, they do not require administrative permits to be able to circulate with them. However, the hidden reality shows that its adaptation is proving problematic. In fact, the increase in the number of vehicles and their coexistence with the rest of the users and means of transport is already beginning to be reflected in the accident rate data. The number of accidents caused by personal mobility vehicles in recent years has been gradually increasing. Consequently, the efficient management and control of traffic in the main cities is becoming a great challenge for the bodies responsible for mobility and public order. In addition, the recent pedestrianisation and traffic restriction ordinances have further complicated the situation, since they have decreed areas in which circulation by means of personal mobility vehicles is strictly prohibited, for which reason access control systems to manage and verify said imposition would also be required.

Currently there are a large number of road sensors based on configurations of magnetic coils and different electronic units for monitoring basic road data such as the number and type of vehicles that travel the roads, the speed at which the vehicles circulate or the direction in which they do. However, all these configurations, as well as their electronic measurement circuits, are specifically designed for monitoring classic combustion vehicles on urban and interurban roads and not for personal mobility vehicles, which are generally smaller and lighter.

The classic coil configurations are made up of 2×2 metre magnetic coils, which are mostly installed forming dual systems made up of two coils per lane, since this layout allows for a greater amount of information to be obtained. In addition, due to its geometric and electromagnetic characteristics, the oscillation frequency of the sensor system is usually comprised between 100 and 200 kHz, which is a low working frequency that facilitates sampling, capture, and signal processing.

In recent years, novel coil models with different configurations have been presented, the double coil being one of the most innovative arrangements, since it manages to suppress the dual systems indicated in the preceding paragraph by installing a single double coil. This innovation has the advantage of reducing the margin of error in speed calculation compared to previous systems. However, the double coil models are still designed to monitor and extract road data from combustion vehicles. Furthermore, dual systems cannot be used to monitor personal mobility vehicles due to their geometric and electromagnetic characteristics.

In addition, the electronic signal processing units of the state of the art are also invalid for monitoring personal mobility vehicles. Current signal processing systems directly obtain frequency measurements through time windows and pulse counting, causing the measurements to be feasible only for coils used on urban roads and combustion vehicles, since the working frequency range is low, such as has been indicated, between 100 kHz and 200 kHz. Moreover, when the double coils are transferred to the bicycle lanes to monitor personal mobility vehicles, a series of problems arise. Thus, reducing the size of the coil causes the working frequency to increase significantly; the oscillation frequency of the system is inversely proportional to the size of the coils, causing existing commercial equipment for monitoring traffic by means of coils to become completely unusable.

Document U.S. Pat. No. 6,360,163B1 discloses a vehicle detector comprising: (a) a loop sensor having inductance, and resonant frequencies which change according to changes in the loop inductance caused by passing vehicles; (b) a PLL (Phase-Locked Loop) connected to said loop sensor which issues vehicle detection signals upon detecting changes in the resonant frequencies of said loop sensor; (c) a frequency change detector which is connected to said loop sensor in parallel to said PLL; (d) a micro-processor which includes a logic circuit whose output is generated using signals from said PLL and said frequency change detector and which determines the vehicle detection based on the output of said logic circuit.

Document US2002175833 (A1) discloses an apparatus and method for activating an inductance loop vehicle detection system, wherein a magnet is attached to a vehicle. In order to activate the inductance loop vehicle detection system, the vehicle, and attached magnet, are moved in relation to an induction loop embedded within a roadway. A reaction between the magnet and the induction loop causes the inductance loop vehicle detection system to register the presence of a vehicle.

Document WO9729468A1 discloses a road vehicle monitoring system which describes a methodology based on two conventional coils separated by a certain distance, i.e., a dual magnetic coil, unlike that which the present invention discloses where the use of a double coil, which implies a different calculation methodology and a different field of application, is recommended.

Document WO2004032089A1 discloses a traffic loop detection and calibration system whose objective is to detect patterns and flows of motorised traffic, and where the use of a double magnetic coil is not recommended.

Document WO2007014573A1 discloses a method and a system for the speed of a moving object that is based on a different methodology than that of a double coil that is used in the present application.

Finally, document GB2138613A discloses an inductive loop presence detector, comprising an inductive loop to sense the presence of an object to be detected, a loop oscillator having said inductive loop connected thereto as an element determining frequency of oscillation, sensing circuitry to detect changes in the loop oscillator frequency due to the movement of an object to be detected in the vicinity of said loop, and a filter network inserted between the loop oscillator output and the input of said sensing circuitry to attenuate cross talk due to mutual interference between a plurality of inductive loop detectors.

None of the previous documents describes the use of double coils with a high frequency range (between 400 kHz and 800 kHz) that allows extracting all types of road data corresponding exclusively to personal mobility vehicles.

However, despite the aforementioned problems, which derive directly from the proliferation of these new forms of transport together with the speed and safety restrictions of the new municipal ordinances, there are still no systems or methods specifically designed and tested to control, manage and verify the impact and correct compliance with traffic regulations by users of personal vehicles. As described, there are different road sensors in urban environments, but they do not make it possible to systematically discriminate the typology of personal mobility vehicles or accurately determine the speed at which they travel. In addition, it must be taken into account that the speeds established for each type of vehicle and/or each type of road may vary, complicating the measurement scenario.

DESCRIPTION OF THE INVENTION

An object of the present invention is a system configured with a plurality of road sensors and smart sensors specifically intended for monitoring personal mobility vehicles that are capable of: (a) controlling and managing the use of said vehicles efficiently; (b) guaranteeing the correct coexistence of personal mobility vehicles with the rest of the users of the public road; (c) providing optimum levels of security; and (d) verifying compliance with current regulations. These objects are achieved by the system of claim 1 and the method of claim 4. Other practical embodiments of the present invention are disclosed in the dependent claims.

More specifically, the system for monitoring personal mobility vehicles in urban environments comprising a double magnetic coil disposed at an area of personal mobility vehicle traffic, and connected to an oscillator circuit; where the assembly of double magnetic coil and oscillator circuit is in turn connected to a phase-locked loop; a signal conditioning circuit connected to the output of the phase-locked loop and a signal processor.

The system is characterised in that the signal processor is configured to calculate the temporal variation in voltage (V(t), V'(t)) produced in the phase-locked loop and due to a variation in the oscillation frequency of the double magnetic coil when at least one personal mobility vehicle passes said double magnetic coil; and to establish, based on the calculation of the temporal variation in voltage (V(t), V'(t)), the type, speed, direction of travel and length of the personal mobility vehicle that has generated the variation in the oscillation frequency of the double magnetic coil.

Moreover, the method for monitoring personal mobility vehicles in urban environments that is implemented in a system according to that which is described above and that is characterised in that it comprises the steps of:
- detecting whether or not there is a variation in voltage in a double magnetic coil installed in an area of personal mobility vehicle traffic;
- detecting the presence of a vehicle when there is a variation in voltage in the double magnetic coil;
- obtaining a magnetic profile of the vehicle which is a measurement of voltage as a function of time V(t) which allows calculating its derivative V'(t) to calculate the maxima and minima of the function V(t) and to establish, at least:
  (a) the classification and typology of the personal mobility vehicle;
  (b) the speed and length of the personal mobility vehicle as it passes over the coil;
  (c) the direction of travel of the personal mobility vehicle; and
  (d) vehicle density in a given area.

The main novelty that the invention provides compared to the known state of the art consists of a novel configuration of the information acquisition and processing system based on a double coil capable of monitoring personal mobility vehicles.

The double coil is specific for bike lanes, while the electronic unit is configured to discriminate the type of personal mobility vehicles and determine their speed and direction of travel due to the fact that it operates in a higher frequency range (between 400 kHz and 800 kHz) than those which are described in the state of the art (100-200 kHz).

The operation of the system is based on the variation in the inductance that is registered in the coils during vehicle traffic over same. These detectors are buried in the pavement and are connected to an electronic unit containing an oscillator circuit, which is usually located in a booth on the nearest sidewalk. In this way, when a vehicle or any object built with ferromagnetic materials passes through the magnetic field generated around the coils, the magnetic field decreases due to the parasitic currents induced therein, which in turn cause a decrease in the coil inductance.

The starting point for the detection and extraction of information is based on observing the variation in oscillation frequency of the system during vehicle traffic over the coils as a function of time. With this, it is possible to obtain what is commonly known as the «magnetic profile of the vehicle». This magnetic footprint depends mainly on parameters related to the vehicle, such as its length, engine position or number of axles, among others. Therefore, what is really useful is that the magnetic profile is different for each type of vehicle, which makes it possible to count them, classify them, extract information, estimate traffic density and control vehicle access to certain regulated areas.

Due to the increase in the working frequency due to the dimensions of the new configuration, the invention implements a phase-locked loop to detect the passage of vehicles over the coils and thus extract the magnetic profile of the vehicles. Thus, the present invention is optimised to be used on bicycle lanes and in personal mobility vehicles other than combustion vehicles. In addition, although the electronic units made up of PLL circuits that are disclosed in the state of the art make it possible to detect the passage of a vehicle, under no circumstances does it make it possible to discriminate the typology thereof or to find out the speed and direction of travel, which the present invention enables due to the signal processing used.

Throughout the description and the claims, the word "comprises" and its variants are not intended to exclude other technical features, components or steps. For those skilled in the art, other objects, advantages and features of the invention will be deduced from both the description and the practical use of the invention. The following usage examples and associated figures are provided for illustrative and non-limiting purposes. Furthermore, the present invention covers all possible combinations of particular and preferred embodiments indicated herein.

BRIEF EXPLANATION OF THE DRAWINGS

What follows is a very brief description of a series of drawings that aid in better understanding the invention and which are expressly related to an embodiment of said invention that is illustrated by way of a non-limiting example of the same.

DETAILED DESCRIPTION OF AN EMBODIMENT OF THE INVENTION

As explained throughout this specification, the object of the system and method for monitoring personal mobility vehicles (MVP) in urban environments is not only to detect the presence of an MVP (which we remember are those in accordance with DGT instruction 16/V-124) but also obtain all kinds of information about this vehicle, such as speed, type, direction of travel and length by means of a double coil (1) disposed under the pavement of an urban road connected to an electronic unit (2 to 5) configured to process the data coming from the coil.

Personal mobility vehicles, as indicated, are understood as those which are described in instruction 16/V-124 of the Spanish General Directorate of Traffic (DGT) and, in general, refer to any electric, human or mixed electric-human traction vehicle that cannot be classified as motor vehicles and are intended for use on specific or generic urban roads (for example, bike lanes), in some cases including sidewalks. Therefore, the present invention intends to exclude from its use any vehicle classified as a motor vehicle, defined as mechanical-traction vehicles with a combustion engine, hybrid engine or electric engine classified as motor vehicles (cars, large cylinder capacity motorcycles, buses or trucks, all of them with and without a trailer).

In the present invention, the double magnetic coil (1) has been geometrically modified, since in general it has maximum measurements of 0.5×0.4 metres, with a number of turns between 5 and 8, as well as an oscillation frequency between 400 kHz and 800 kHz. As the size of the coils has been reduced, same work at approximately 400 kHz in the absence of MVP, which increases by around 3% when the MVP passes the coil. However, these values are adjustable depending on the scenario and the specific application of the system.

Figure 1:
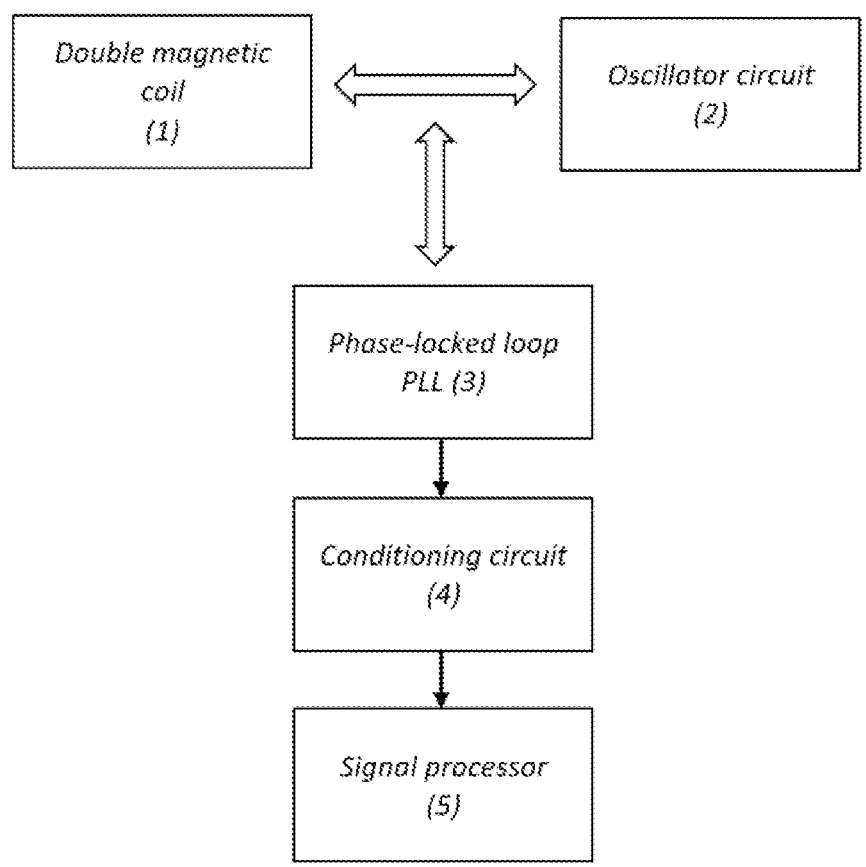
FIG. 1 shows a diagram of the system for monitoring personal mobility vehicles in urban environments, object of the present invention.

As can be seen in FIG. 1, the system that is the object of the present invention comprises a double magnetic coil (1) which in a particular, non-limiting embodiment has measurements of 48×32 centimetres with 7 turns in the inner and outer loops. This double magnetic coil (1) is connected to an oscillator circuit (2) implemented with a NAND logic gate.

The assembly of double magnetic coil (1) and the oscillator (2) is connected to a phase-locked loop or PLL circuit (3) designed with a Lead-Lap filter and a voltage controlled oscillator or VCO configured to provide variation in voltages as a function of the oscillation frequency of the system.

Finally, the phase-locked loop (3) is connected to a signal conditioning circuit (4) specifically implemented with an instrumentation amplifier. The conditioned signal then goes to a signal processor (5) that digitises and processes the signal by means of different algorithms, obtaining as a result the road parameters indicated above, that is, speed, typology, direction of travel and length of the vehicle.

In general, the presence of at least one personal mobility vehicle on the double magnetic coil (1) causes a decrease in the loop inductance, which in turn produces a frequency modulation, i.e., an increase in the oscillation frequency of the complete system. In the known systems of the state of the art, measurements are taken directly from the value of the oscillation frequency of the system and the characteristic magnetic imprint of each vehicle is obtained therewith. However, the system of the invention obtains the same magnetic profile by measuring the voltage, since, as previously described, the phase-locked loop (3) provides voltage levels equivalent to the frequency deviation caused by the personal mobility vehicle traffic over the double magnetic coil (1).

The signal processor (5) comprises a logic processing unit and a memory or memories that store a program or programs made up of a plurality of instructions which, when executed by the logic processing unit, cause the signal processor (5) to execute the method in FIG. 2 and explained in more detail below.

Figure 2:
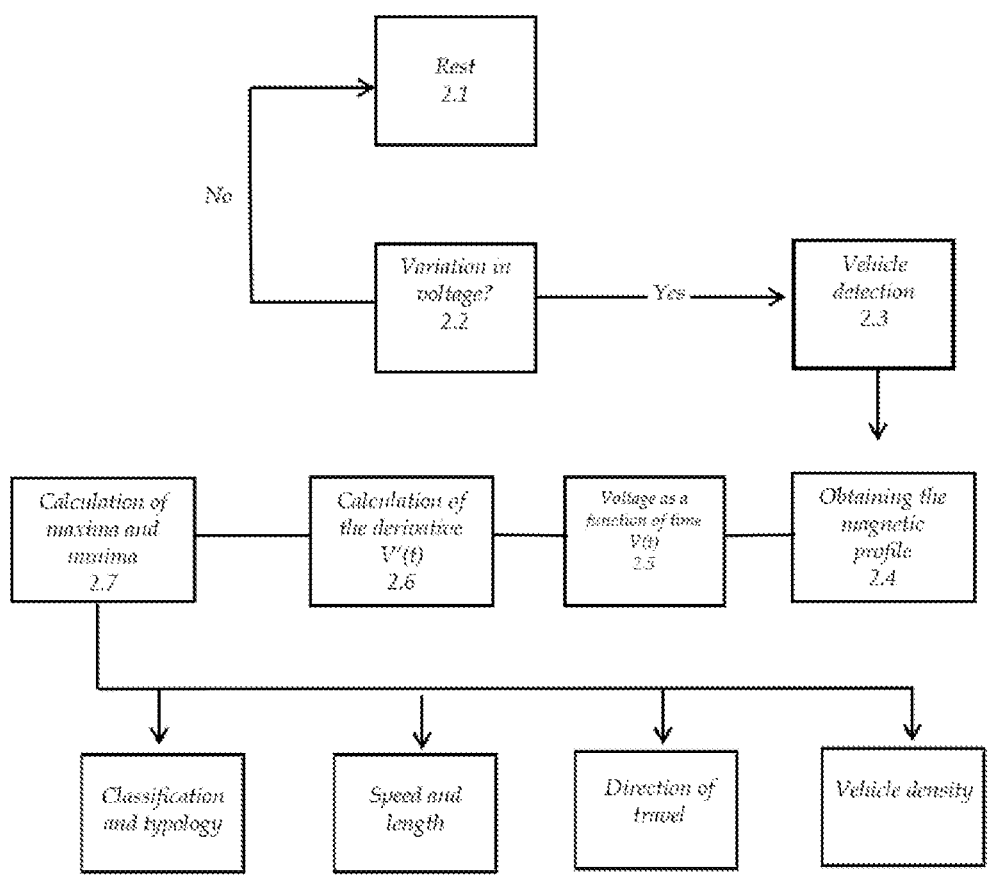
FIG. 2 shows a diagram of the monitoring method implemented in the system of FIG. 1 and which is another object of the present invention.

As can be seen in FIG. 2, firstly and from the point of rest (2.1), the processor (5) detects whether or not there is a variation in voltage (2.2). If there is no variation in voltage, the processor (5) remains at rest (2.1). However, if there is a variation in voltage (2.2) the presence of a vehicle is detected (2.3) and a magnetic profile of the vehicle is obtained (2.4).

This magnetic profile is a measurement of voltage as a function of time V(t) (2.5) which allows calculating its derivative V'(t) (2.6) to calculate the maxima and minima (2.7) of the function V(t) and to establish, at least: (a) the classification and typology of the personal mobility vehicle; (b) the speed and length of the personal mobility vehicle as it passes over the coil (1); (c) the direction of travel of the personal mobility vehicle; and (d) density of vehicles in a given area.

Figure 3:
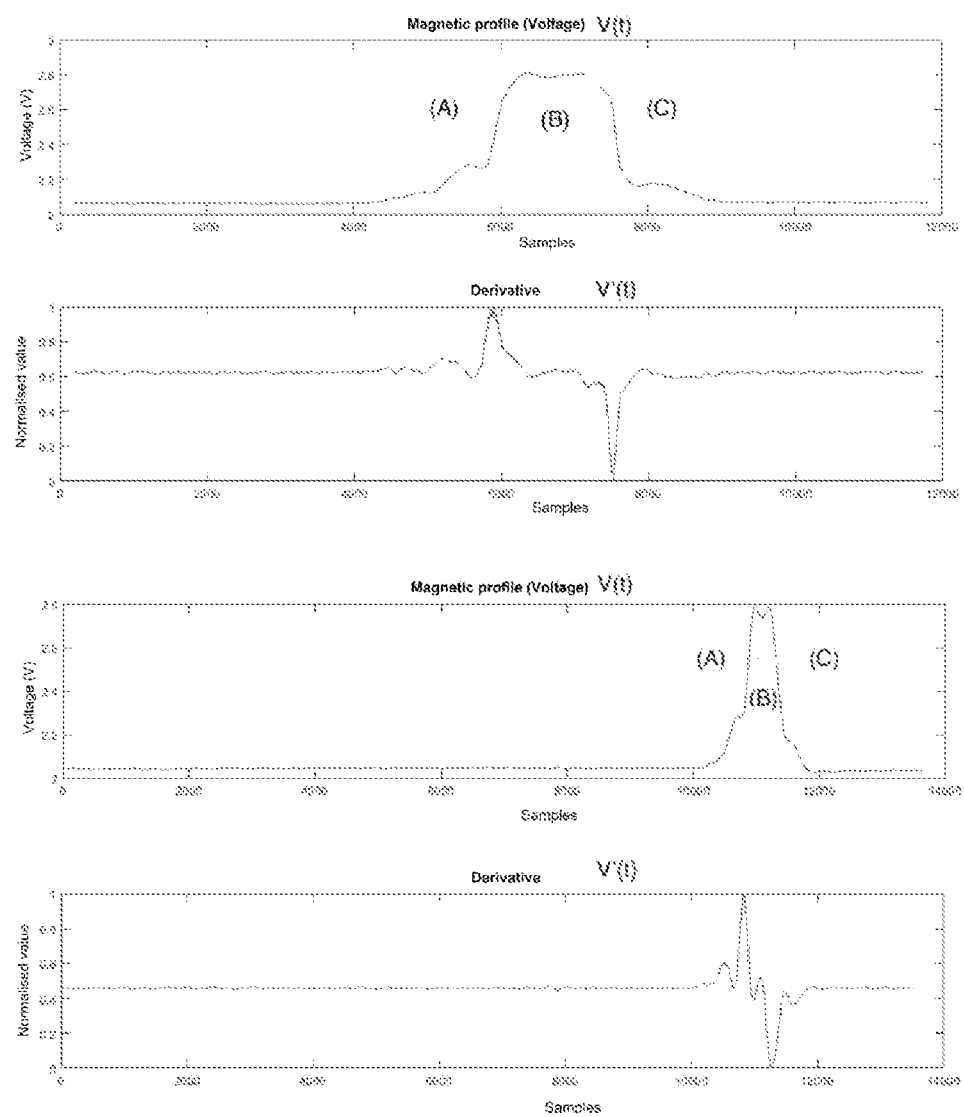
FIG. 3 shows a series of curves representing a magnetic profile generated by a personal mobility vehicle in the system of FIG. 1 when the method of FIG. 2 is applied.

FIG. 3 shows different curves of a magnetic profile of a non-limiting exemplary embodiment of a personal mobility vehicle. The curves represent two functions V(t) and V'(t)

for two different speeds (the two upper curves are slower and the two lower curves are faster). These curves are the graphical representation of the magnetic fingerprint detected by the signal processor (5) and correspond to the temporal function of voltage (V(t)) and its derivative (V'(t)).

Thus, the essential parts A-B-C of a non-limiting exemplary embodiment of an electric personal mobility vehicle (specifically, an electric scooter) are indicated in each graph and which are the parts that cause the greatest variations in inductance in the double magnetic coil (1) and, therefore, to be reflected in the magnetic profiles shown in the curves of FIG. 2. These parts, referenced in this non-limiting exemplary embodiment as A-B-C are the following: (A) motor integrated in the front wheel, stator with copper windings, rotor with ferrite and aluminium casing; (B) aluminium compartment where the lithium batteries and power electronics are housed; and (C) rear wheel with aluminium rim and brake disc.

FIG. 3, as indicated, represents four curves, where the first two (two upper ones) correspond to the magnetic profile generated by the personal mobility vehicle at low speed and its corresponding derivative, and the next two (two lower curves) correspond to the profile generated by the same vehicle, but at a higher speed and its corresponding derivative.

Thus, in the first place, it is observed how the first step obtained (A) corresponds to the motorised wheel. This wheel achieves a more abrupt variation in voltage than the rear wheel (point C) because the motor is located in the front wheel (A), motor which contains copper windings and more ferromagnetic material than the rear wheel (C). In addition, it can be said that the motor creates a magnetic field that causes this change to be much more pronounced.

Moreover, it is observed how (B) forms a "plateau" in voltage because it is located at the base of the personal mobility vehicle. In other words, the vehicle is completely on top of the double magnetic coil (1). Between the points (A) and (B) indicated in the graphs, the moment in which the main wheel has crossed the last segment of the coil (1) can be observed, as well as between points (B) and (C) is observed how the rear wheel enters the double magnetic coil (1). These two slopes are also different due to the different amount of ferromagnetic material present in the two wheels. This can be better appreciated at point (C) where only the rear wheel remains within the double magnetic coil (1).

The invention claimed is:

1. A system for monitoring personal mobility vehicles in urban environments comprising a double magnetic coil (1) disposed at an area of personal mobility vehicle traffic, and connected to an oscillator circuit (2); where the assembly of double magnetic coil (1) and oscillator circuit (2) is in turn connected to a phase-locked loop (3); a signal conditioning circuit (4) connected to the output of the phase-locked loop (3) and a signal processor (5);
wherein the system is characterised in that
the double magnetic coil (1) has maximum measurements of 0.5×0.4 metres, with a number of turns between 5 and 8 and an oscillation frequency between 400 kHz and 800 kHz;
and in that the signal processor (5) is configured to calculate the temporal variation in voltage (V(t)) and its derivative (V'(t)) produced in the phase-locked loop (3) and due to a variation in the oscillation frequency of the double magnetic coil (1) when at least one personal mobility vehicle passes said double magnetic coil (1); and to establish, based on the calculation of the temporal variation in voltage (V(t)) and its derivative (V'(t)), the type, speed, direction of travel and length of the personal mobility vehicle that has generated the variation in the oscillation frequency of the double magnetic coil (1).

2. The system according to claim 1, wherein the phase-locked loop (3) comprises at least one Lead-Lap filter and a voltage-controlled oscillator or VCO; and wherein the phase-locked loop (3) is configured to provide variation in voltages as a function of the oscillation frequency of the assembly formed by the double magnetic coil (1) and the oscillator circuit (2).

3. The system according to claim 1, wherein the signal processor (5) comprises a logic processing unit and a memory or memories that store a program or programs made up of a plurality of instructions which, when executed by the logic processing unit, cause the signal processor (5) to:
obtain a magnetic profile of the vehicle, which is a measurement of voltage as a function of time V(t) which allows calculating its derivative V'(t) to calculate the maxima and minima of the function V(t) and to establish, based on said maxima and minima, at least:
(a) the classification and typology of the personal mobility vehicle;
(b) the speed and length of the personal mobility vehicle as it passes over the coil (1);
(c) the direction of travel of the personal mobility vehicle; and
(d) vehicle density in a given area.

4. A method for monitoring personal mobility vehicles in urban environments that is implemented in a system according to claim 1, that is characterised in that it comprises the steps of:
detecting whether or not there is a variation in voltage (2.2) in a double magnetic coil (1) installed in an area of personal mobility vehicle traffic;
detecting the presence of a vehicle (2.3) when there is a variation in voltage (2.2) in the double magnetic coil (1)
obtaining a magnetic profile of the vehicle (2.4) which is a measurement of voltage as a function of time V(t) (2.5) which allows calculating its derivative V'(t) (2.6) to calculate the maxima and minima (2.7) of the function V(t) and to establish, at least:
(a) the classification and typology of the personal mobility vehicle;
(b) the speed and length of the personal mobility vehicle as it passes over the coil (1);
(c) the direction of travel of the personal mobility vehicle; and
(d) vehicle density in a given area.

* * * * *

UNITED STATES PATENT AND TRADEMARK OFFICE
CERTIFICATE OF CORRECTION

PATENT NO. : 12,243,419 B2  
APPLICATION NO. : 18/267955  
DATED : March 4, 2025  
INVENTOR(S) : Antonio Mocholí Salcedo Page 1 of 1

It is certified that error appears in the above-identified patent and that said Letters Patent is hereby corrected as shown below:

On the Title Page

Item (71)  
Correct the Applicants information to read as follows:  
-- Universitat Politécnica de Valéncia, Valencia (ES) --;

Item (30) Foreign Application Priority Data  
Correct the foreign application number to read as follows:  
-- P202031271 --.

Signed and Sealed this  
Fifteenth Day of April, 2025

Coke Morgan Stewart  
*Acting Director of the United States Patent and Trademark Office*